US007020217B1

(12) United States Patent
Parsons et al.

(10) Patent No.: US 7,020,217 B1
(45) Date of Patent: Mar. 28, 2006

(54) SATELLITE DIGITAL AUDIO RADIO RECEIVER WITH INSTANT REPLAY CAPABILITY

(75) Inventors: Gary Parsons, Potomac, MD (US); Craig Wadin, Sunrise, FL (US)

(73) Assignee: XM Satellite Radio, Inc., Washington, DC (US)

( * ) Notice: Subject to any disclaimer, the term of this patent is extended or adjusted under 35 U.S.C. 154(b) by 0 days.

(21) Appl. No.: 09/435,316

(22) Filed: Nov. 4, 1999

(51) Int. Cl.
*H03K 9/00* (2006.01)

(52) U.S. Cl. .................................................... 375/316

(58) Field of Classification Search ........... 375/240.01, 375/240.15, 240.27, 316, 324, 340, 341, 375/325; 455/412, 161.1, 182.3, 413, 186.1, 455/185.1, 412.2, 567, 226.1, 12.1, 2.01; 348/731, 725, 739, 567, 555
See application file for complete search history.

(56) References Cited

U.S. PATENT DOCUMENTS

| | | | | |
|---|---|---|---|---|
| 5,585,858 | A * | 12/1996 | Harper et al. | 348/473 |
| 5,592,471 | A * | 1/1997 | Briskman | 455/506 |
| 5,689,245 | A * | 11/1997 | Noreen et al. | 340/825.49 |
| 5,812,937 | A * | 9/1998 | Takahisa et al. | 455/45 |
| 5,861,881 | A * | 1/1999 | Freeman et al. | 707/500.1 |
| 5,978,689 | A * | 11/1999 | Tuoriniemi et al. | 455/569.1 |
| 6,018,649 | A * | 1/2000 | Ruhl | 455/186.1 |
| 6,021,325 | A * | 2/2000 | Hall | 455/412 |
| 6,064,441 | A * | 5/2000 | Okamoto | 348/460 |
| 6,088,351 | A * | 7/2000 | Jenkin et al. | 370/347 |
| 6,118,498 | A * | 9/2000 | Reitmeier | 348/725 |
| 6,118,996 | A * | 9/2000 | Kowaguchi et al. | 455/422 |
| 6,167,253 | A * | 12/2000 | Farris et al. | 455/412 |
| 6,236,694 | B1 * | 5/2001 | Blatter et al. | 375/363 |
| 6,285,872 | B1 * | 9/2001 | Murata | 455/415 |
| 6,289,207 | B1 * | 9/2001 | Hudecek et al. | 455/150.1 |
| 6,340,997 | B1 * | 1/2002 | Borseth | 348/554 |
| 6,353,444 | B1 * | 3/2002 | Katta et al. | 345/716 |
| 6,374,225 | B1 * | 4/2002 | Hejna, Jr. | 704/270 |
| 6,385,532 | B1 * | 5/2002 | Dance et al. | 701/207 |
| 6,424,816 | B1 * | 7/2002 | Stephens | 455/2.01 |
| 6,456,841 | B1 * | 9/2002 | Tomimori | 455/412.2 |
| 6,463,486 | B1 * | 10/2002 | Parry et al. | 710/52 |
| 6,810,233 | B1 * | 10/2004 | Patsiokas | 455/3.02 |
| 2002/0183059 | A1 * | 12/2002 | Noreen et al. | 455/427 |

* cited by examiner

*Primary Examiner*—Emmanuel Bayard
(74) *Attorney, Agent, or Firm*—William J. Benman

(57) ABSTRACT

A receiver adapted to receive a transmitted signal and provide a replay capability in response thereto. The inventive receiver includes the medium (electronic or physical) for storing at least a portion of the received signal. In accordance with present teachings, the inventive receiver selectively outputs either a stored selection or the receive signal in response to user input (i.e. a replay signal). In the illustrative embodiment, the receiver is a satellite digital audio radio service receiver having a radio frequency tuner and audio decoder. The system controller is a microprocessor that causes the system to store each selection as it is received. In the best mode, this is facilitated by the transmission and receipt of a start of selection signal and an end of selection signal. The replay signal is provided via a user interface. Software running on a microprocessor includes code for detecting the presence of the instant replay signal. On detection of the replay signal, the software causes the system to output the stored selection.

41 Claims, 5 Drawing Sheets

SATELLITE DIGITAL AUDIO RADIO RECEIVER WITH INSTANT REPLAY CAPABILITY

BACKGROUND OF THE INVENTION

1. Field of the Invention

The present invention relates to communications systems. More specifically, the present invention relates to satellite digital audio service (SDARS) receiver architectures.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Satellite radio operators will soon provide digital quality radio broadcast services covering the entire continental United States. These services intend to offer approximately 100 channels, of which nearly 50 channels will provide music with the remaining stations offering news, sports, talk and data channels. According to C. E. Unterberg, Towbin, satellite radio has the capability to revolutionize the radio industry, in the same manner that cable and satellite television revolutionized the television industry.

Satellite radio has the ability to improve terrestrial radio's potential by offering a better audio quality, greater coverage and fewer commercials. Accordingly, in October of 1997, the Federal Communications Commission (FCC) granted two national satellite radio broadcast licenses. The FCC allocated 25 megahertz (MHz) of the electromagnetic spectrum for satellite digital broadcasting, 12.5 MHz of which are owned by CD Radio and 12.5 MHz of which are owned by the assignee of the present application "XM Satellite Radio Inc.". The FCC further mandated the development of interoperable receivers for satellite radio reception, i.e. receivers capable of processing signals from either CD Radio or XM Radio broadcasts. The system plan for each licensee presently includes transmission of substantially the same program content from two or more geosynchronous or geostationary satellites to both mobile and fixed receivers on the ground. In urban canyons and other high population density areas with limited line-of-sight (LOS) satellite coverage, terrestrial repeaters will broadcast the same program content in order to improve coverage reliability. Some mobile receivers will be capable of simultaneously receiving signals from two satellites and one terrestrial repeater for combined spatial, frequency and time diversity, which provides significant mitigation against multipath and blockage of the satellite signals. In accordance with XM Radio's unique scheme, the 12.5 MHz band will be split into 6 slots. Four slots will be used for satellite transmission. The remaining two slots will be used for terrestrial re-enforcement.

In accordance with the XM frequency plan, each of two geostationary Hughes 702 satellites will transmit identical or at least similar program content. The signals transmitted with QPSK modulation from each satellite (hereinafter satellite1 and satellite2) will be time interleaved to lower the short-term time correlation and to maximize the robustness of the signal. For reliable reception, the LOS signals transmitted from satellite1 are received, reformatted to Multi-Carrier Modulation (MCM) and rebroadcast by non-line-of-sight (NLOS) terrestrial repeaters. The assigned 12.5 MHz bandwidth (hereinafter the "XM" band) is partitioned into two equal ensembles or program groups A and B. The use of two ensembles allows 4096 Mbits/s of total user data to be distributed across the available bandwidth. Each ensemble will be transmitted by each satellite on a separate radio frequency (RF) carrier. Each RF carrier supports up to 50 channels of music or data in Time Division Multiplex (TDM) format. With terrestrial repeaters transmitting an A and a B signal, six total slots are provided, each slot being centered at a different RF carrier frequency. The use of two ensembles also allows for the implementation of a novel frequency plan which affords improved isolation between the satellite signals and the terrestrial signal when the receiver is located near the terrestrial repeater.

A need has been recognized in the art for an ability to provide a listener with the capability of replaying a selection received via the SDARS receiver.

SUMMARY OF THE INVENTION

The need in the art is addressed by the system and method of the present invention. In a most general embodiment, the system is implemented as a receiver adapted to receive a transmitted signal and provide an instantaneous output signal in response thereto. The inventive receiver includes the medium (electronic or physical) for storing at least a portion of the received signal. In accordance with present teachings, the inventive receiver selectively outputs either a stored selection or the receive signal in response to user input (i.e. a replay signal).

In the illustrative embodiment, the receiver is a satellite digital audio radio service receiver having a radio frequency tuner and audio decoder. The system controller is a microprocessor that causes the system to store each selection as it is received. In the best mode, this is facilitated by the transmission and receipt of a start of selection signal and an end of selection signal. The replay signal is provided via a user interface. Software running on a microprocessor includes code for detecting the presence of the instant replay signal. On detection of the replay signal, the software causes the system to output the stored selection.

DESCRIPTION OF THE INVENTION

Illustrative embodiments and exemplary applications will now be described with reference to the accompanying drawings to disclose the advantageous teachings of the present invention.

Figure 1:
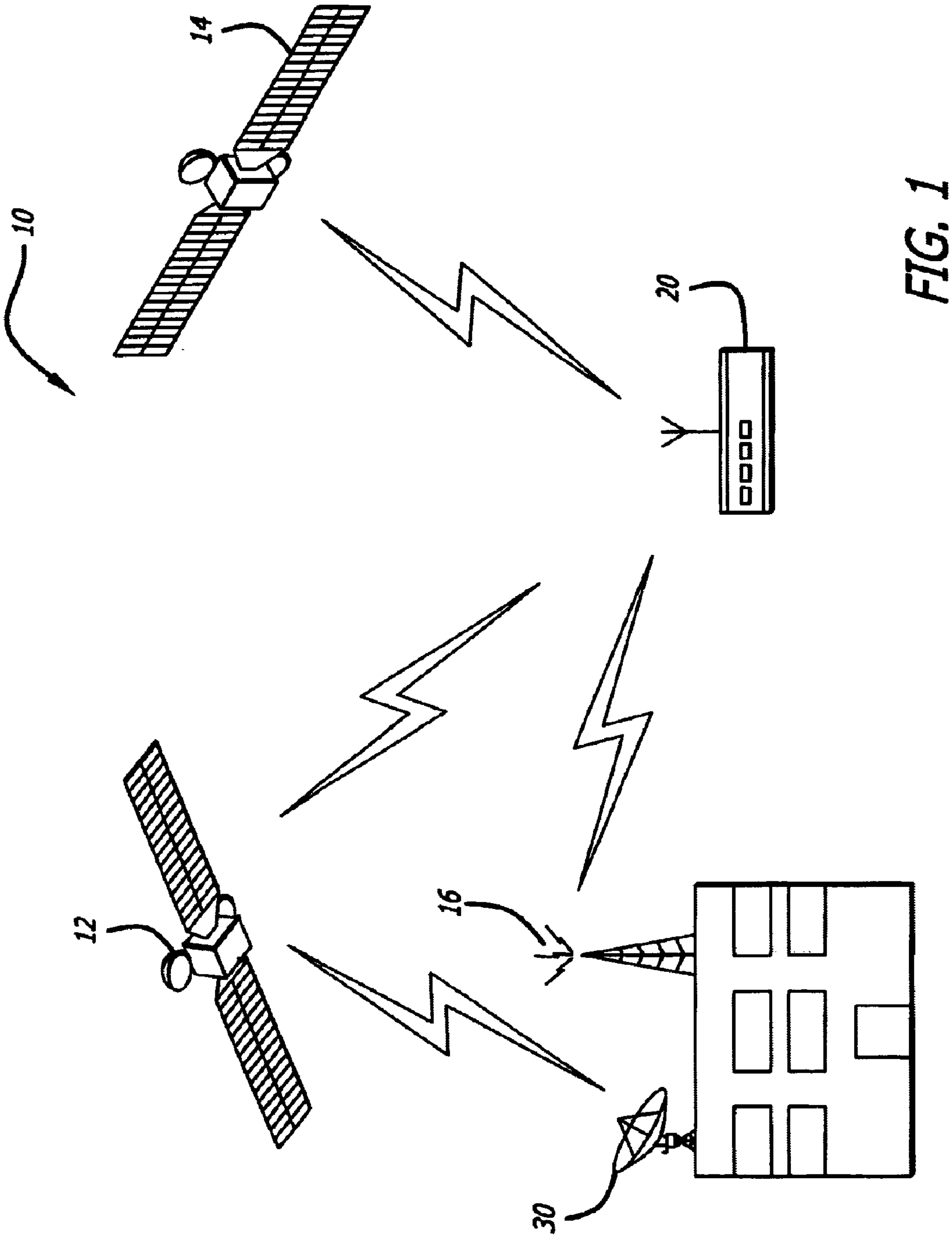
FIG. 1 is an illustrative implementation of a satellite digital audio service system receiver architecture constructed in accordance with the teachings of the present invention.

An illustrative implementation of a satellite digital audio service (SDARS) system architecture is depicted in FIG. 1. The system 10 includes first and second geostationary satellites 12 and 14 which transmit line-of-sight (LOS) signals to SDARS receivers located on the surface of the earth. The satellites provide for interleaving and spatial diversity. The system 10 further includes plural terrestrial repeaters 16 which receive and retransmit the satellite signals to facilitate reliable reception in geographic areas where LOS reception from the satellites is obscured by tall buildings, hills, tunnels and other obstructions. The signals transmitted by the satellites 12 and 14 and the repeaters 16 are received by an SDARS receiver 20. The receiver 20 may be located in an automobile, handheld or in a stationary unit for home or office use. The SDARS receiver 20 is designed to receive one or both of the satellite signals and the signals from the terrestrial repeaters and combine or select one of the signals as the receiver output as discussed more fully below.

Figure 2:
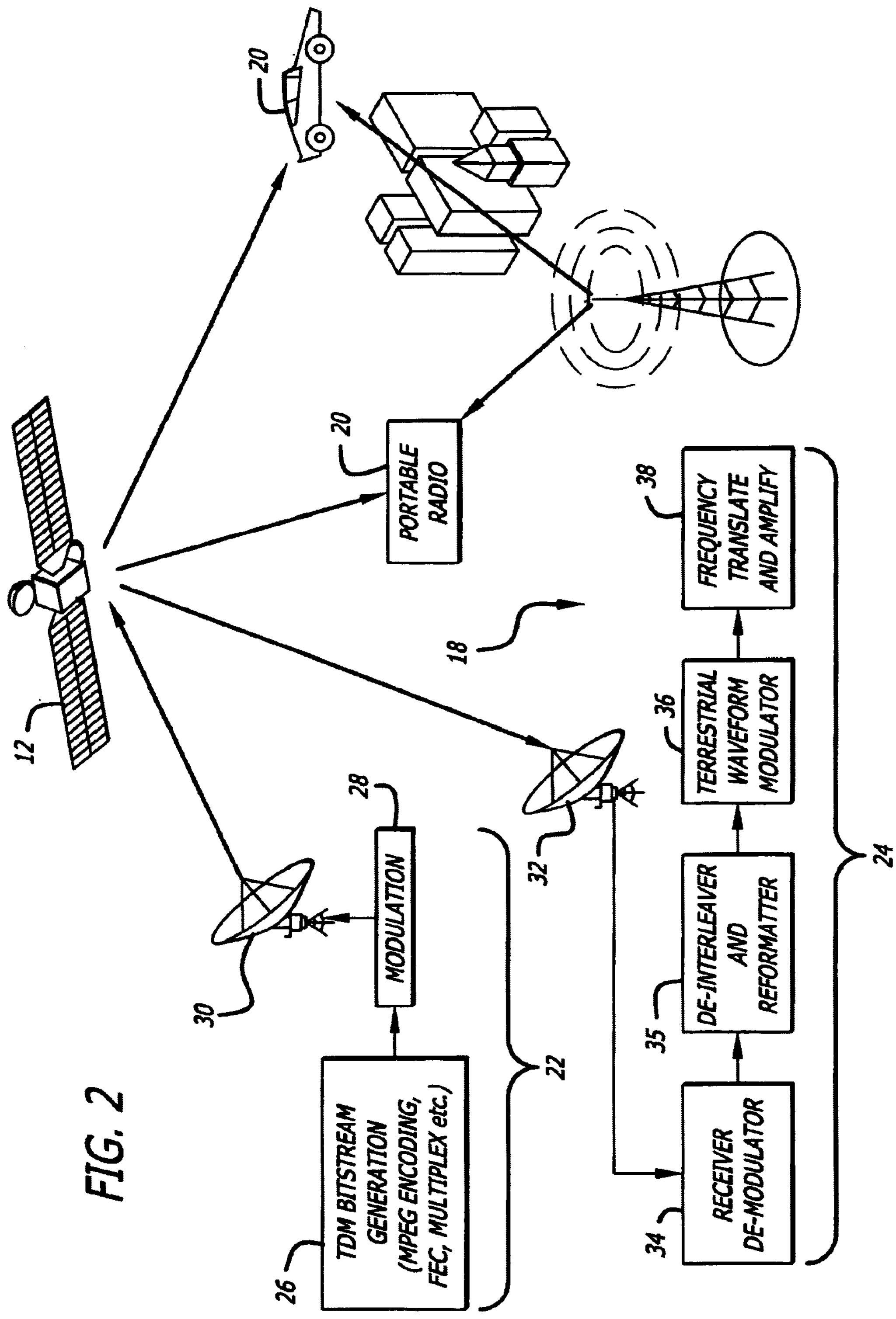
FIG. 2 is a diagram which illustrates the system of FIG. 1 in greater detail.

FIG. 2 is a diagram which illustrates the system 10 of FIG. 1 in detail with a single satellite and a single terrestrial repeater. FIG. 2 shows a broadcast segment 22 and a terrestrial repeater segment 24. In the preferred embodiment, an incoming bit stream is encoded into a time division multiplexed (TDM) signal using a coding scheme such as MPEG by an encoder 26 of conventional design. The TDM bit stream is upconverted to RF by a conventional quadrature phase-shift keyed (QPSK) modulator 28. The upconverted TDM bit stream is then uplinked to the satellites 12 and 14 by an antenna 30. Those skilled in the art will appreciate that the present invention is not limited to the broadcast segment shown. Other systems may be used to provide signals to the satellites without departing from the scope of the present teachings.

The satellites 12 and 14 act as bent pipes and retransmit the uplinked signal to terrestrial repeaters 18 and portable receivers 20. As illustrated in FIG. 2, the terrestrial repeater includes a receiver demodulator 34, a de-interleaver and reformatter 35, a terrestrial waveform modulator 36 and a frequency translator and amplifier 38. The receiver and demodulator 34 downconverts the downlinked signal to a TDM bitstream. The de-interleaver and reformatter 35 reorders the TDM bitstream for the terrestrial waveform. The digital baseband signal is then applied to a terrestrial waveform modulator 36 (e.g. MCM or multiple carrier modulator) and then frequency translated to a carrier frequency prior to transmission.

Figure 2A:
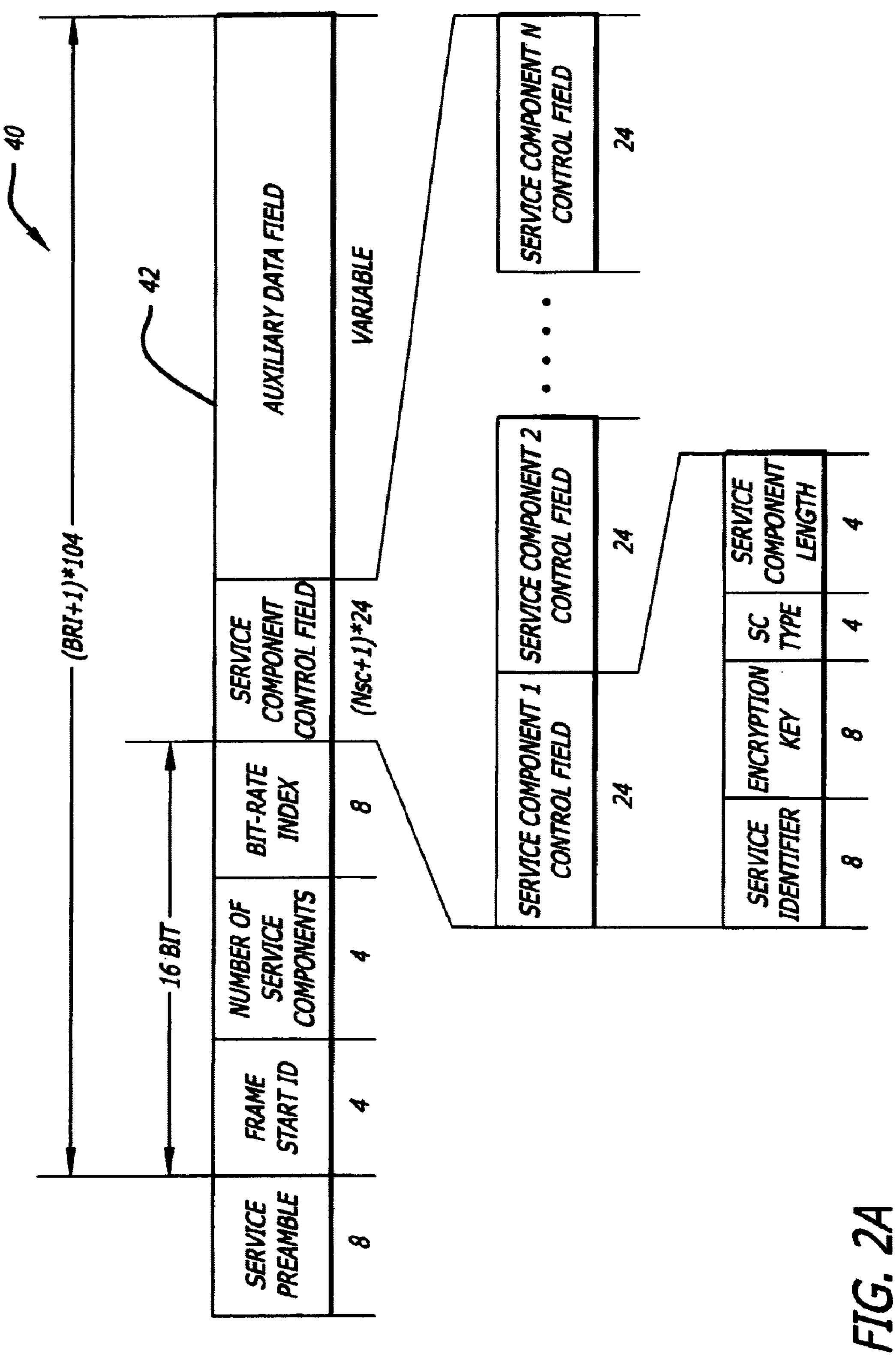
FIG. 2*a* is a diagram of an illustrative bitstream used by the satellite digital audio radio receiver with instant replay capability of the present invention.

In accordance with the present teachings, the digital baseband signal includes a number of audio selections along with a signal which indicates the beginning and end thereof. FIG. 2*a* is a diagram which shows what this digital signal might look like.

FIG. 2*a* is a diagram of an illustrative bitstream used by the satellite digital audio radio receiver with instant replay capability of the present invention. The bitstream a Service Control Header 40 and a content payload (not shown). The Service Control Header includes, inter alia, an Auxiliary Data Field 42. The Auxiliary Data Field 42 is a time multiplexed message structure which is used to carry the following information:

Service control and status information
Narrowcast Categories
Start/End of program
Program(Song) ID
Display information
News ticker
Text associated with a program (e.g. streaming text)
Replacement text (TBC) (e.g. extended service label, song/artist label, etc.)
Other text information (e.g. sports scores, weather, etc.)

The frequency-translated signal will be received by a number of satellite digital audio radio receivers such as that depicted in FIG. 3 below.

Figure 3:
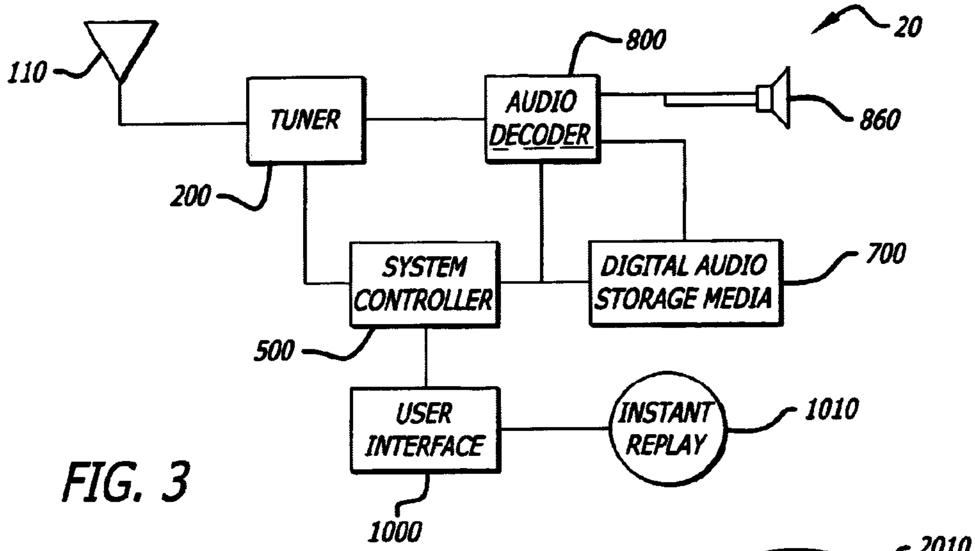
FIG. 3 is a simplified block diagram of an illustrative implementation of a satellite digital audio radio service receiver incorporating the teachings of the present invention.

FIG. 3 is a simplified block diagram of an illustrative implementation of a satellite digital audio radio service receiver incorporating the teachings of the present invention. The receiver 20 includes an antenna 110, an RF tuner module 200, a digital audio storage media 700, an audio decoder 800, a system controller 500, and a user interface 1000. The interface 1000 is adapted to receive an instant replay input from a user via a suitable input device 1010. The input device 1010 may be a simple button or a microphone with voice recognition capability.

Figure 4:
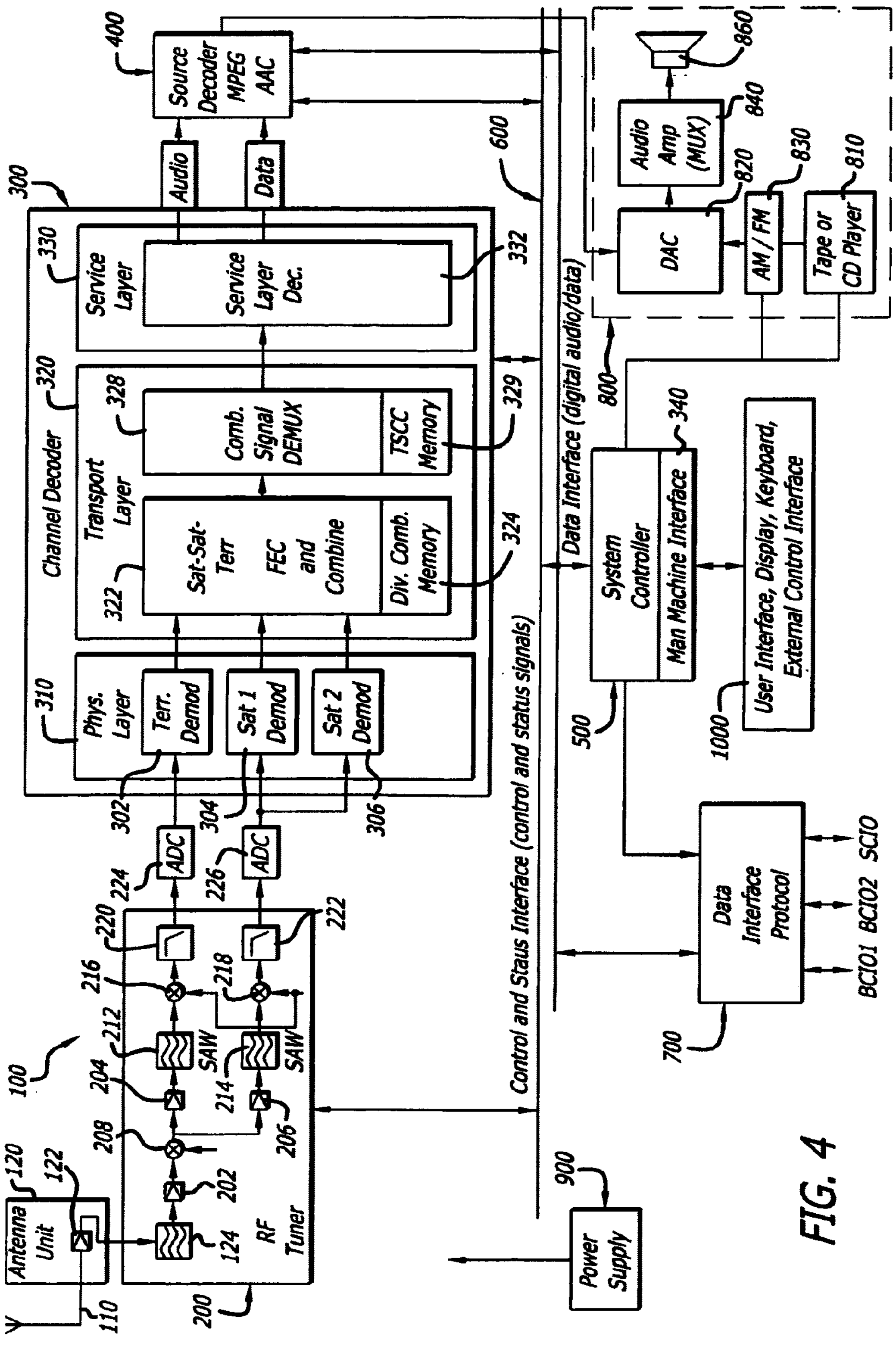
FIG. 4 is a detailed block diagram of the illustrative implementation of the receiver of FIG. 3.

FIG. 4 is a detailed block diagram of the illustrative implementation of the SDARS receiver of FIG. 3. FIG. 4 shows that the receiver 20 further includes an antenna module 100, the antenna 110, the RF tuner module 200, a channel decoder 300, a source decoder 400, a digital control and status interface bus 600, the system controller 500, digital audio storage media 700, the audio decoder 800, a power supply 900, and the user interface 1000. The SDARS receiver is disclosed in accordance with the teachings of U.S. patent application Ser. No. 09/435,317, entitled Tuner Architecture for Satellite and Terrestrial Reception of Signals, filed Nov. 04, 1998 by P. Marko and A. Nguyen, the teachings of which are incorporated herein by reference.

Returning to FIG. 3, in the illustrative embodiment, the digital audio storage media 700 is essentially a cycle buffer and may be optical, electronic or physical as will be appreciated by those of ordinary skill in the art. In the best mode, system controller 500 includes a microprocessor that causes the system to store each selection as it is received. In the illustrative embodiment, this is facilitated by the transmission and receipt of a ‘start of selection’ signal and an ‘end of selection’ signal. A replay signal is provided via the Instant Replay interface 1010 and, in accordance with present teachings, the inventive receiver selectively outputs either a stored selection or the receive signal in response thereto. As discussed more fully below, software running on a microprocessor includes code for detecting the presence of the instant replay signal. On detection of the replay signal, the software causes the system to output the stored selection.

Figure 5:
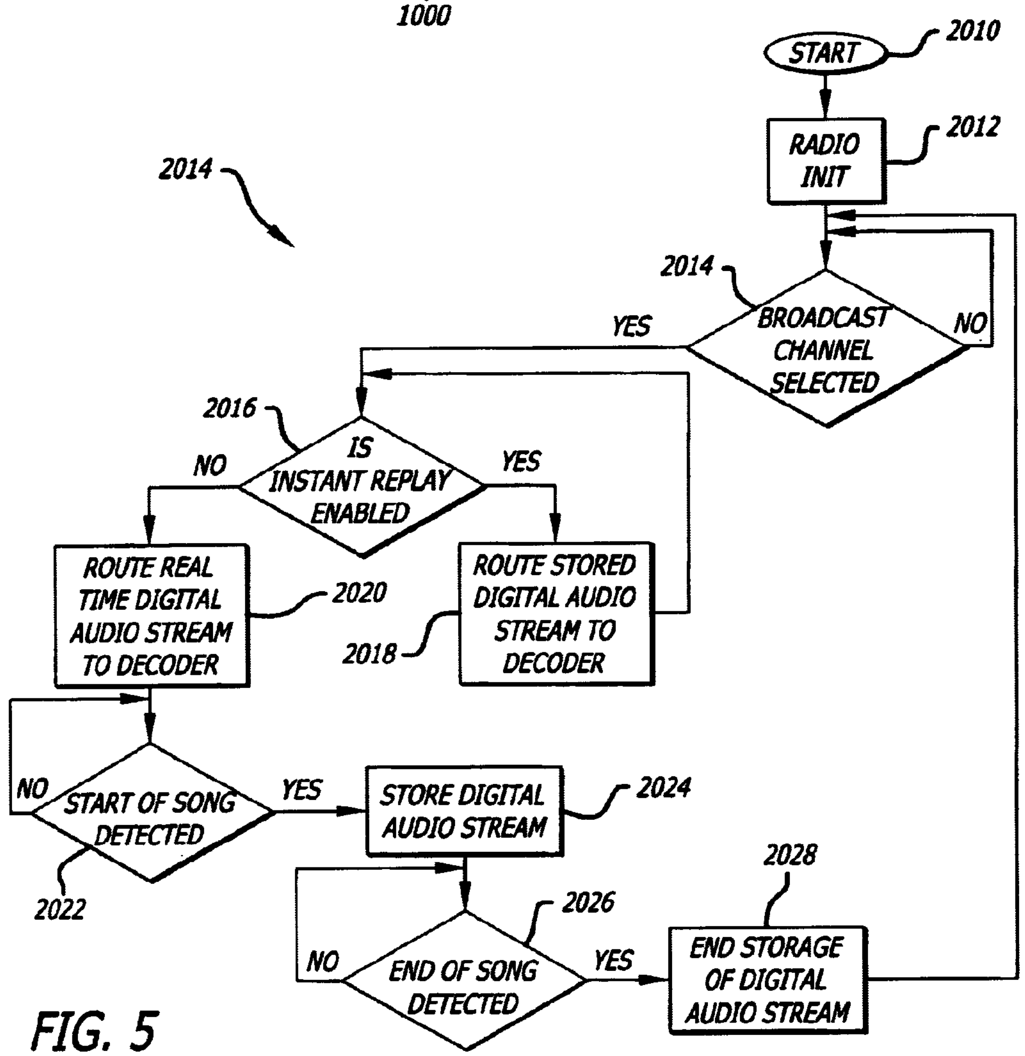
FIG. 5 is a flow chart illustrative of the instant replay method of the present invention implemented in software and run by the microprocessor of the system controller of the satellite digital audio receiver with instant replay capability of the present invention.

FIG. 5 is a flow chart illustrative of the instant replay method of the present invention implemented in software and run by the microprocessor of the system controller of the satellite digital audio receiver with instant replay capability of the present invention. As shown in FIG. 5, the flow chart 2000 begins with initialization of the radio at steps 2010 and 2012. At step 2014, the system checks to determine whether a broadcast channel has been selected. If not, the instant replay system remains inactive until a broadcast channel is selected.

At step 2016, on the selection of a broadcast channel, the system controller checks for the activation of the instant replay feature via the instant replay interface 1010 via the user interface 1000. If the instant replay feature has been activated, at step 2018, the system controller 500 routes stored digital audio from the digital audio storage media 700 to the audio decoder 800 for output via the speaker 860.

If, at step 2016, the instant replay feature has not been activated, then, at step 2020, the system controller 500 routes received digital audio from the tuner 200 to the audio decoder 800 for output via the speaker 860.

Next, at step 2022, the system controller 500 is commanded to check for the receipt of a 'start of selection' indication. On receipt of the start of selection indication, at step 2024, the system controller 500 activates the digital audio storage media 700 and routes the selection being received by the tuner 200 thereto. The system controller 500 continues to stream the received digital audio to the storage media 700 until, at step 2026, the system controller 500 is commanded to check for the receipt by the tuner 200 of an end of selection signal. On receipt of the end of selection signal, at step 2028, the system controller 500 ends storage of the received digital audio stream. Thereafter, the system checks whether the broadcast channel is still selected at step 2014, and, if so, awaits the next activation of the instant replay feature at step 2016.

Thus, the present invention has been described herein with reference to a particular embodiment for a particular application. Those having ordinary skill in the art and access to the present teachings will recognize additional modifications, applications and embodiments within the scope thereof. For example, plural media storage devices or areas within a single device may be employed to store more than a single selection at a time or to store information being received on one ensemble while the user is listening to another ensemble. Further, those skilled in the art will appreciate that the information may be encoded and/or compressed prior to storage to minimize the stored requirement and/or maximize system performance without departing from the scope of a present teachings.

It is therefore intended by the appended claims to cover any and all such applications, modifications and embodiments within the scope of the present invention.

Accordingly;

What is claimed is:

1. A mobile receiver comprising:

first means for receiving a satellite digital audio radio service signal and providing an instantaneous output signal in response thereto;

second means for storing at least a portion of said received signal;

third means for providing a replay signal; and fourth means for selectively outputting said stored portion of said received signal or said instantaneous output signal in response to said replay signal, said first, second, third and fourth means being disposed on a common mobile platform.

2. The invention of claim 1 wherein said first means includes an audio decoder.

3. The invention of claim 1 wherein said third means includes a user interface.

4. The invention of claim 1 wherein said fourth means is a system controller.

5. The invention of claim 4 wherein said system controller includes a microprocessor.

6. The invention of claim 5 wherein said fourth means includes software running on said microprocessor.

7. The invention of claim 6 wherein said replay signal is an instant replay signal and said software includes code for detecting the presence of said instant replay signal.

8. The invention of claim 7 wherein said software includes code for causing said receiver to output said stored portion of said received signal on the detection of said instant replay signal.

9. The invention of claim 8 wherein said software includes code for causing said receiver to output said instantaneous output signal on a failure to detect said instant replay signal.

10. The invention of claim 7 wherein said received signal includes a start of selection signal and an end of selection signal and said software includes code for detecting said start of selection signal and said end of selection signal.

11. The invention of claim 10 wherein said software includes code for activating said second means in response to detection of said start of selection signal.

12. The invention of claim 11 wherein said software includes code for deactivating said second means in response to detection of said end of selection signal.

13. The invention of claim 6 wherein said software includes code for detecting the selection of a broadcast channel.

14. A satellite digital audio receiver comprising:

a radio frequency tuner and an audio decoder for receiving a transmitted satellite digital audio radio service signal and providing an instantaneous output signal in response thereto;

a user interface for providing a replay signal;

means for detecting a beginning and an ending of program content provided in said received signal and storing said program content in response to said replay signal and a system controller including a microprocessor for selectively outputting said program content or said instantaneous output signal in response to said replay signal.

15. The invention of claim 14 wherein said system controller includes software running on said microprocessor.

16. The invention of claim 15 wherein said replay signal is an instant replay signal and said software includes code for detecting the presence of said instant replay signal.

17. The invention of claim 16 wherein said software includes code for causing said audio decoder to output said stored program content on the detection of said instant replay signal.

18. The invention of claim 17 wherein said software includes code for causing said audio decoder to output said instantaneous output signal on a failure to detect said instant replay signal.

19. The invention of claim 18 wherein said transmitted signal includes a start of selection signal and an end of selection signal and said software includes code for detecting said start of selection signal and said end of selection signal.

20. The invention of claim 19 wherein said software includes code for causing said system controller to store said instantaneous output signal in said a storage medium in response to detection of said start of selection signal.

21. The invention of claim 20 wherein said software includes code for causing said system controller to stop storing said simultaneous output signal in said storage medium in response to detection of said end of selection signal.

22. The invention of claim 15 wherein said software includes code for detecting the selection of a broadcast channel.

23. A method for receiving a satellite digital audio radio signal including the steps of:

receiving a transmitted satellite digital audio radio service signal and providing an instantaneous output signal in response thereto using a mobile satellite digital audio service receiver;

storing program content in said received signal;

providing a replay signal;

detecting the presence of said instant replay signal; and selectively outputting said stored program content or said instantaneous output signal in response to said replay signal.

24. The invention of claim 23 including the step of causing said receiver to output said stored program content on the detection of said instant replay signal.

25. The invention of claim 24 including the step of causing said receiver to output said instantaneous output signal on a failure to detect said instant replay signal.

26. The invention of claim 25 wherein said transmitted signal includes a start of selection signal and an end of selection signal and said method includes the step of detecting said start of selection signal and said end of selection signal.

27. The invention of claim 26 including the step of activating said step of storing in response to detection of said start of selection signal.

28. The invention of claim 27 including the step of deactivating said step of storing in response to detection of said end of selection signal.

29. The invention of claim 23 including the step of detecting the selection of a broadcast channel.

30. A mobile receiver comprising:

first means for receiving a transmitted satellite digital audio radio service signal and providing an instantaneous output signal in response thereto;

second means for storing at least a portion of said received signal;

third means including a user interface for providing a replay signal; and fourth means for selectively outputting said stored portion of said received signal or said instantaneous output signal in response to said replay signal, said first, second, third and fourth means being disposed on a common mobile platform.

31. A mobile receiver comprising:

first means for receiving a transmitted satellite digital audio radio service signal and providing an instantaneous output signal in response thereto;

second means for storing at least a portion of said received signal;

third means for providing a replay signal; and fourth means for selectively outputting said stored portion of said received signal or said instantaneous output signal in response to said replay signal, said fourth means including a system controller and said first, second, third and fourth means being disposed on a common mobile platform.

32. The invention of claim 31 wherein said system controller includes a microprocessor.

33. The invention of claim 32 wherein said fourth means includes software running on said microprocessor.

34. The invention of claim 33 wherein said replay signal is an instant replay signal and said software includes code for detecting the presence of said instant replay signal.

35. The invention of claim 34 wherein said software includes code for causing said receiver to output said stored portion of said received signal on the detection of said instant replay signal.

36. The invention of claim 35 wherein said software includes code for causing said receiver to output said instantaneous output signal on a failure to detect said instant replay signal.

37. The invention of claim 36 wherein said transmitted signal includes a start of selection signal and an end of selection signal and said software includes code for detecting said start of selection signal and said end of selection signal.

38. The invention of claim 37 wherein said software includes code for activating said second means in response to detection of said start of selection signal.

39. The invention of claim 38 wherein said software includes code for deactivating said second means in response to detection of said end of selection signal.

40. The invention of claim 33 wherein said software includes code for detecting the selection of a broadcast channel.

41. A method for receiving a satellite digital audio radio service signal including the steps of:

receiving a transmitted satellite digital audio radio service signal and providing an instantaneous output signal in response thereto using a mobile satellite digital audio service receiver;

detecting a selection of a broadcast channel;

storing program content in said received signal on said broadcast channel;

providing a replay signal; and selectively outputting said stored program content or said instantaneous output signal in response to said replay signal.

* * * * *